United States Patent
Uchida et al.

(10) Patent No.: US 6,954,477 B2
(45) Date of Patent: Oct. 11, 2005

(54) SEMICONDUCTOR LASER DEVICE AND FABRICATION METHOD THEREOF

(75) Inventors: Shiro Uchida, Miyagi (JP); Tsuyoshi Tojo, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/821,342

(22) Filed: Apr. 9, 2004

(65) Prior Publication Data

US 2004/0233955 A1 Nov. 25, 2004

Related U.S. Application Data

(63) Continuation-in-part of application No. 10/115,314, filed on Apr. 3, 2002, now abandoned.

(30) Foreign Application Priority Data

Apr. 3, 2001 (JP) .................................... P2001-104683

(51) Int. Cl.⁷ ................................................ H01S 5/00
(52) U.S. Cl. ............................. 372/43; 372/44; 372/45; 372/46
(58) Field of Search ............................. 372/43, 44, 46

(56) References Cited

U.S. PATENT DOCUMENTS

| | | | |
|---|---|---|---|
| 6,414,976 B1 * | 7/2002 | Hirata | 372/45 |
| 6,452,954 B2 | 9/2002 | Fukunaga | |
| 6,516,016 B1 | 2/2003 | Fukunaga et al. | |
| 2003/0012243 A1 | 1/2003 | Okumura | |
| 2003/0147438 A1 | 8/2003 | Abeles | |

FOREIGN PATENT DOCUMENTS

| JP | 07-244877 | 9/1995 |
|---|---|---|
| JP | 08-124220 | 5/1996 |
| JP | 10-011801 | 1/1998 |
| JP | 10-021596 | 1/1998 |
| JP | 10-293949 | 11/1998 |
| JP | 11-220210 | 8/1999 |
| JP | 2000-031599 | 1/2000 |
| JP | 2000-196201 | 7/2000 |

* cited by examiner

*Primary Examiner*—Minsun Oh Harvey
*Assistant Examiner*—Dung (Michael) T. Nguyen
(74) *Attorney, Agent, or Firm*—Sonnenschein, Nath & Rosenthal LLP

(57) ABSTRACT

A method of fabricating a ridge-waveguide type semiconductor laser device having a large half-value width and a high kink level is provided. First, an effective refractive index difference $\Delta n$ between an effective refractive index $n_{eff1}$ of the ridge and an effective refractive index $n_{eff2}$ of a portion on each of both sides of the ridge is taken as $\Delta n = n_{eff1} - n_{eff2}$, and a ridge width is taken as W. On such an assumption, constants "a", "b", "c", and "d" of the following three equations are set on X-Y coordinates (X-axis: W, Y-axis: $\Delta n$) The first equation is expressed by $\Delta n \leq a \times W + b$, where "a" and "b" are constants determining a kink level. The second equation is expressed by $W \geq c$, where "c" is a constant specifying a minimum ridge width at the time of formation of the ridge. The third equation is expressed by $\Delta n \geq d$, where "d" is a constant specified by a desired half-width value $\theta_{para}$. Then at least either of a kind and a thickness of an insulating film, a thickness of an electrode film on the insulating film, and a kind and a thickness of a portion, located on each of both the sides of the ridge, of the upper cladding layer is set in such a manner that a combination of $\Delta n$ and W satisfies the above three equations.

7 Claims, 9 Drawing Sheets

$\Delta n = n_{eff1} - n_{eff2}$

SEMICONDUCTOR LASER DEVICE AND FABRICATION METHOD THEREOF

CROSS REFERENCE TO RELATED APPLICATIONS

The present application is a continuation-in-part of application Ser. No. 10/115,314, filed Apr. 3, 2002 now abandoned, which claims the benefit of priority to Japanese Application No. P2001-104683, filed Apr. 3, 2001, both of which are fully incorporated herein to the extent permitted by law.

BACKGROUND OF THE INVENTION

The present invention relates to a ridge-waveguide type semiconductor laser device, and particularly to a ridge-waveguide type semiconductor laser device having a large half-width value $\theta_{para}$ of a far-field pattern (FFP) in a direction horizontal to a hetero-interface, and having a desired laser characteristic at the time of operation with a high power.

In semiconductor laser devices including long-wavelength GaAs or INP based semiconductor laser devices and short-wavelength nitride based III–V group compound semiconductor laser devices, a ridge-waveguide type semiconductor laser device has been often used in various applications for a reason of easy fabrication and the like.

A ridge-waveguide type semiconductor laser is one of index guided types configured such that an upper portion of an upper cladding layer and a contact layer are formed into a stripe-shaped ridge, and both sides of the ridge and portions, located on both sides of the ridge, of the upper cladding layer are covered with an insulating layer to form a current construction layer and also an effective refractive index difference is provided in the lateral direction, whereby a mode control is performed.

Figure 4:
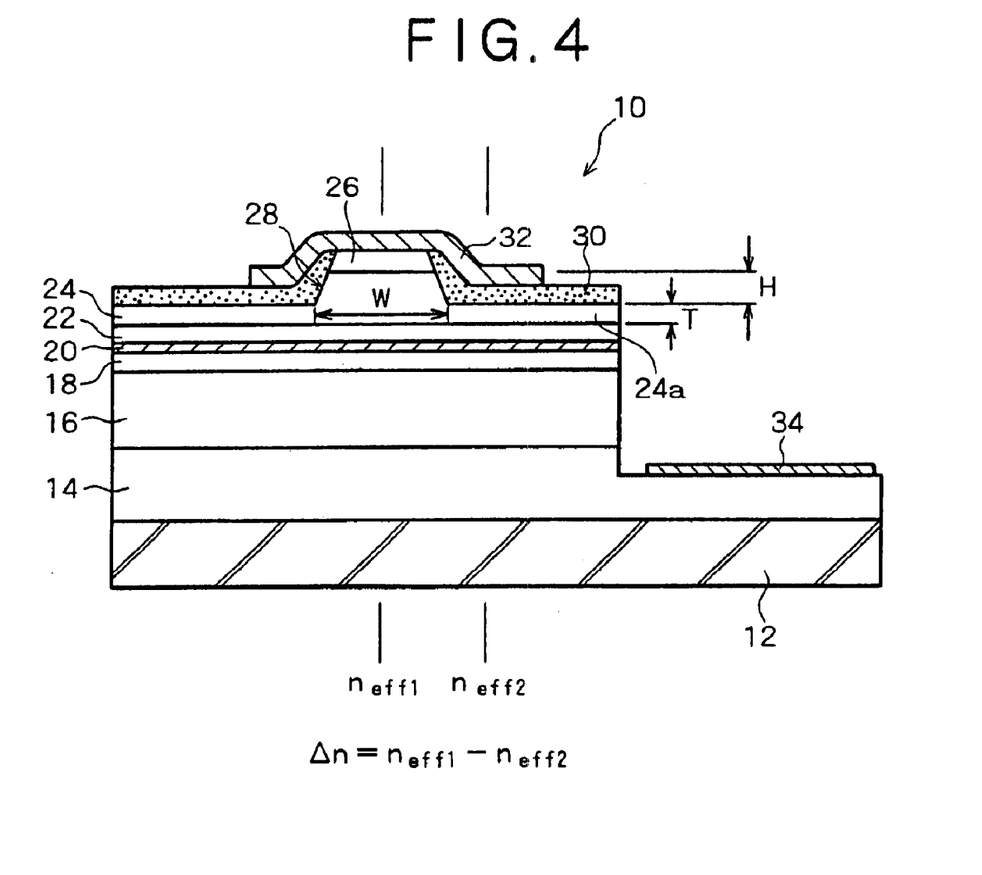
FIG. 4 is a sectional view showing a configuration of a typical nitride based semiconductor laser device.

A configuration of a short-wavelength ridge-waveguide type nitride based III–V group compound semiconductor laser device (hereinafter, referred to as "nitride based semiconductor laser device") will be described with reference to FIG. 4. FIG. 4 is a sectional view showing a configuration of a nitride based semiconductor laser device.

Referring to FIG. 4, a nitride based semiconductor laser device 10 basically has a stacked structure in which a plurality of layers are stacked on a sapphire substrate 12 via a GaN buffer layer (not shown). The plurality of layers stacked on the sapphire substrate 12 are an n-GaN contact layer 14, an N—AlGaN (content of Al:8%) cladding layer 16 having a thickness of 1.0 μm, an n-GaN optical guide layer 18 having a thickness of 0.1 μm, an MQW (Multiple Quantum Well) active layer 20 of three well layers, a p-GaN optical guide layer 22 having a thickness of 0.1 μm, a p-(GaN:Mg/AlGaN)-SLS (strained-layer superlattice) cladding layer 24, and a p-GaN contact layer 26 having a thickness of 0.1 μm.

In this stacked structure, an upper portion of the p-cladding layer 24 and the p-contact layer 26 are formed as a stripe-shaped ridge 28. An upper portion of the n-contact layer 14, the n-cladding layer 16, the n-optical guide layer 18, the MQW active layer 20, the p-optical guide layer 22, and remaining layer portions 24a of the p-cladding layer 24 are formed as a mesa structure extending in the same direction as the extending direction of the ridge 28.

A ridge width W of the ridge 28 is typically set to 1.6 μm, a ridge height H is typically set to 0.6 μm, and a thickness T of each of the remaining layer portions 24a, located on both sides of the ridge 28, of the p-cladding layer 24 is typically set to 0.15 μm.

An insulating film 30 composed of an $SiO_2$ film is formed on both side surfaces of the ridge 28 and the remaining layer portions 24a, located on both the sides of the ridge 28, of the p-cladding layer 24.

A p-side electrode 32 composed of a multi-layer metal film made from Pd/Pt/Au is formed on the insulating film 30 in such a manner as to be brought into contact with the p-contact layer 26 via a window formed in the insulating film 30. An n-side electrode 34 composed of a multi-layer metal film made from Ti/Pt/Au is formed on the n-contact layer 14.

By the way, along with the expanded applications of nitride based semiconductor laser devices, it has been required to increase a half-value width (hereinafter, referred to as "$\theta_{para}$") of a far-field pattern (FFP) in the direction being horizontal to a hetero interface of a resonance structure, and to keep a desired optical power-injected current characteristic up to a high power region by increasing a kink level.

For example, when used as a light source of an optical pickup, a nitride based semiconductor laser device has been required to have the half-value width $\theta_{para}$ as large as 7° or more and a kink level as high as about 60 mW.

However, in the case of setting structure factors, such as a ridge width or a thickness of a remaining layer portion of an upper cladding layer, of a nitride based semiconductor laser device, any design criterion being necessary and sufficient to meet the above-described strict requirement has not been established.

For example, since a design range of a nitride based semiconductor laser device is very narrow, if the half-value width $\theta_{para}$ of the far-field pattern (FFP) for an elliptic beam in a direction parallel to the hetero interface is set to 7° or more, then the kink characteristic may be degraded. Accordingly, it becomes very important to clarify such a design range.

While the problem of the related art has been described by example of a nitride based semiconductor laser device, a long-wavelength ridge-waveguide type semiconductor laser device, which is longer in oscillation wavelength than the nitride based semiconductor laser device, for example, a GaAs or InP based ridge-waveguide type semiconductor laser device has the same problem.

SUMMARY OF THE INVENTION

An object of the present invention is to provide a ridge-waveguide type semiconductor laser device having a large half-value width $\theta_{para}$, and keeping a desired optical power-injected current characteristic up to a high power region, that is, having a high kink level, and to provide a method of fabricating the ridge-waveguide type semiconductor laser device.

Figure 5:
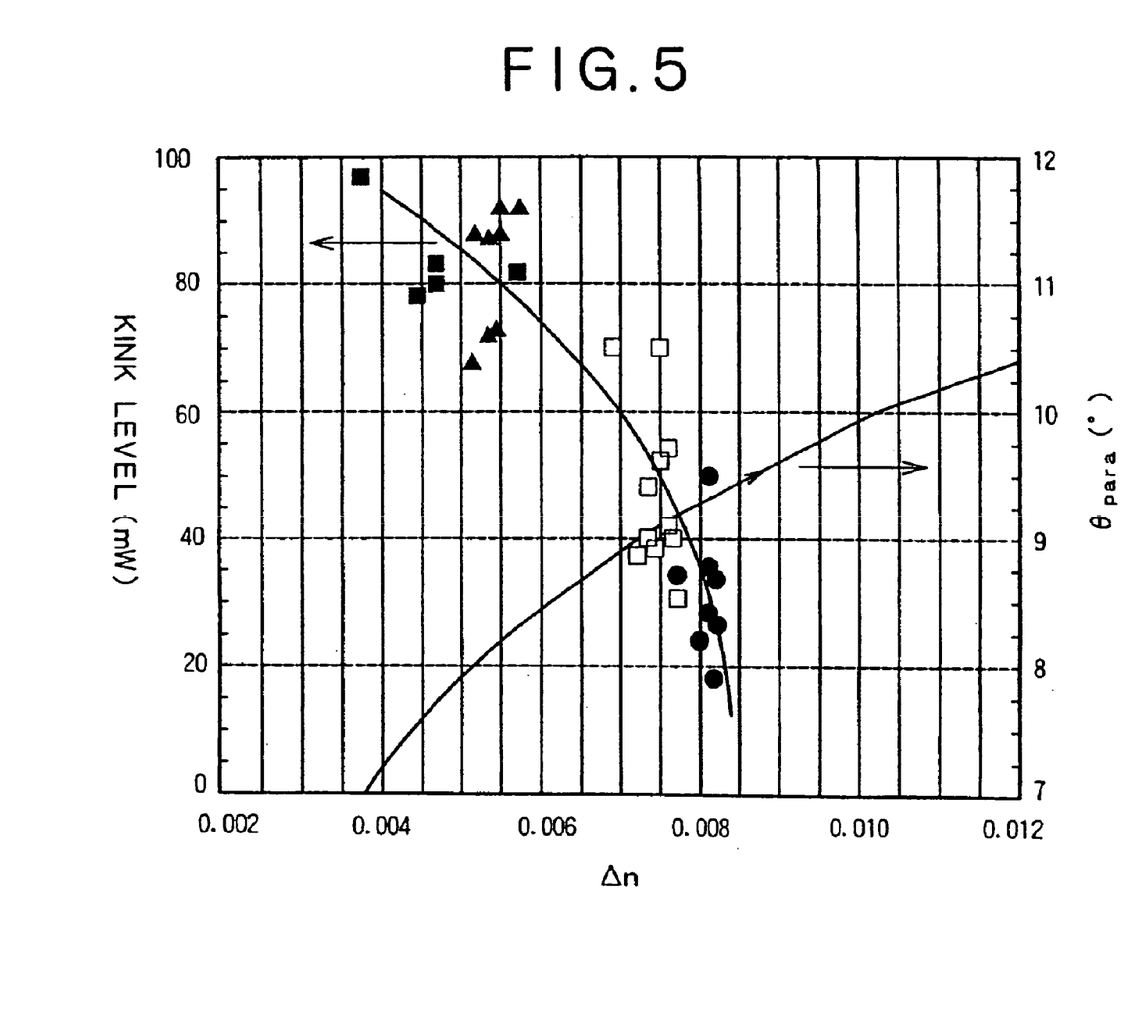
FIG. 5 is a graph showing a relationship between an effective refractive index difference Δn and a half-value widths $\theta_{para}$ and a relationship between the effective refractive index difference Δn and a kink level.

As a result of various experiments in the course of studies made for solving the above-described problems, the present inventor has found that as shown in FIG. 5, a half-value width $\theta_{para}$ has a close relationship with an effective refractive index difference Δn of a ridge waveguide, and that in order to make a half-value width $\theta_{para}$ large, it is required to make the effective refractive index difference Δn large. It is to be noted that marks indicating the experimental results are omitted for simplicity in FIG. 5.

The effective refractive index difference Δn of a ridge waveguide is, as shown in FIG. 4, is defined as a difference ($n_{eff1}-n_{eff2}$) between an effective refractive index $n_{eff1}$ of the ridge for an oscillation wavelength and an effective refractive index $n_{eff2}$ of a portion located on each of both sides of the ridge for the oscillation wavelength.

Figure 6:
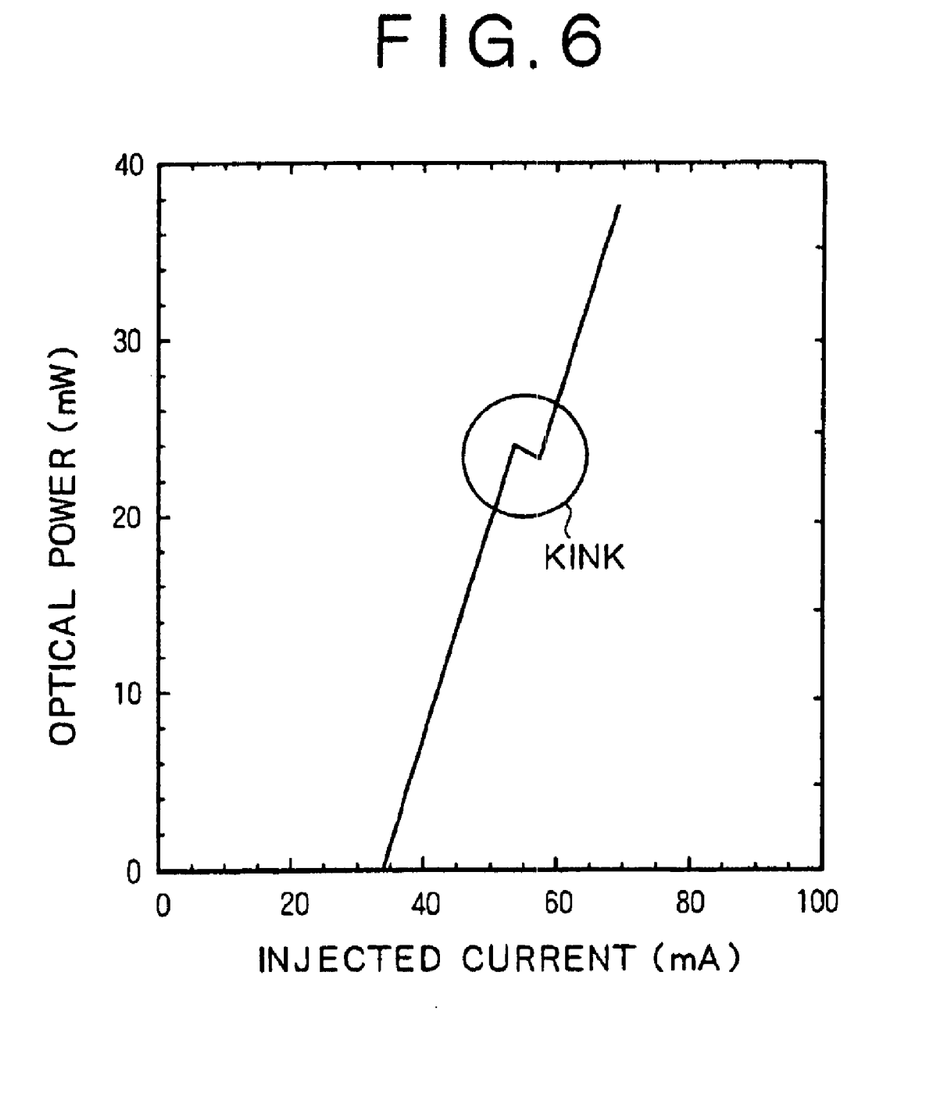
FIG. 6 is a typical diagram illustrating a kink in an optical power-injected current characteristic.

However, as the effective refractive index difference $\Delta n$ becomes large, a cutoff ridge width against a higher-order horizontal transverse mode tends to become narrow. The cutoff ridge width against a higher-order horizontal transverse mode means a ridge width which does not allow occurrence of any higher-order horizontal transverse mode. If the ridge width is a cutoff ridge width value or more, the horizontal transverse mode is easier to be shifted from a fundamental mode to a primary mode. If a hybrid mode of the fundamental horizontal transverse mode and a higher-order horizontal transverse mode occurs, then as shown in FIG. 6, in the step of increasing an injected current for making an optical power large, a kink occurs in an optical power-injected current characteristic, thereby degrading a laser characteristic at the time of operation with a high power.

With respect to the above kink level, the present inventor has made various experiments, and found that as shown in FIG. 5, the kink level has a close relationship with the effective refractive index difference $\Delta n$ of a ridge waveguide, and that in order to make the kink level high, it is required to make the effective refractive index difference $\Delta n$ small. It is to be noted that difference marks in FIG. 5 show the experimental results.

Figure 7:
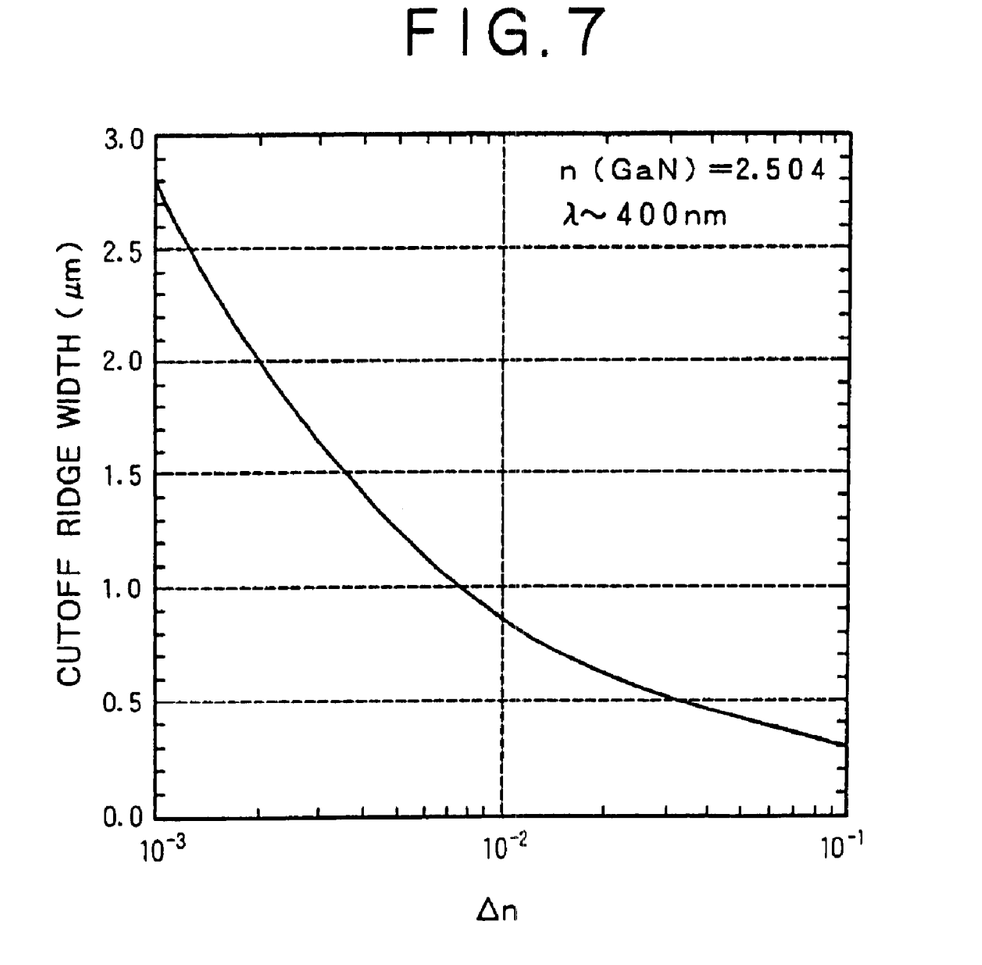
FIG. 7 is a graph showing a relationship between an effective refractive index difference Δn and a cutoff ridge width.

On the basis of the studies made by the present inventor, since a ridge-waveguide type nitride based semiconductor laser device has a small effective refractive index difference $\Delta n$ and has a short oscillation wavelength, a cutoff ridge width against a higher-order horizontal transverse mode is narrow as shown in FIG. 7. FIG. 7 is a graph showing a relationship between an effective refractive index difference $\Delta n$ between an effective refractive index of the ridge formed by a GaN layer and an effective refractive index of a portion located on each of both sides of the ridge, which relationship is obtained under a condition that the refractive index of the GaN layer is set to 2.504 and the oscillation wavelength $\lambda$ is set to 400 nm.

For example, when the effective refractive index difference $\Delta n$ of a ridge waveguide is set to be in a range of 0.005 to 0.01, a ridge width is required to be narrowed to about 1 μm for keeping the ridge width in a range of a cutoff ridge width value or less.

Figure 8:
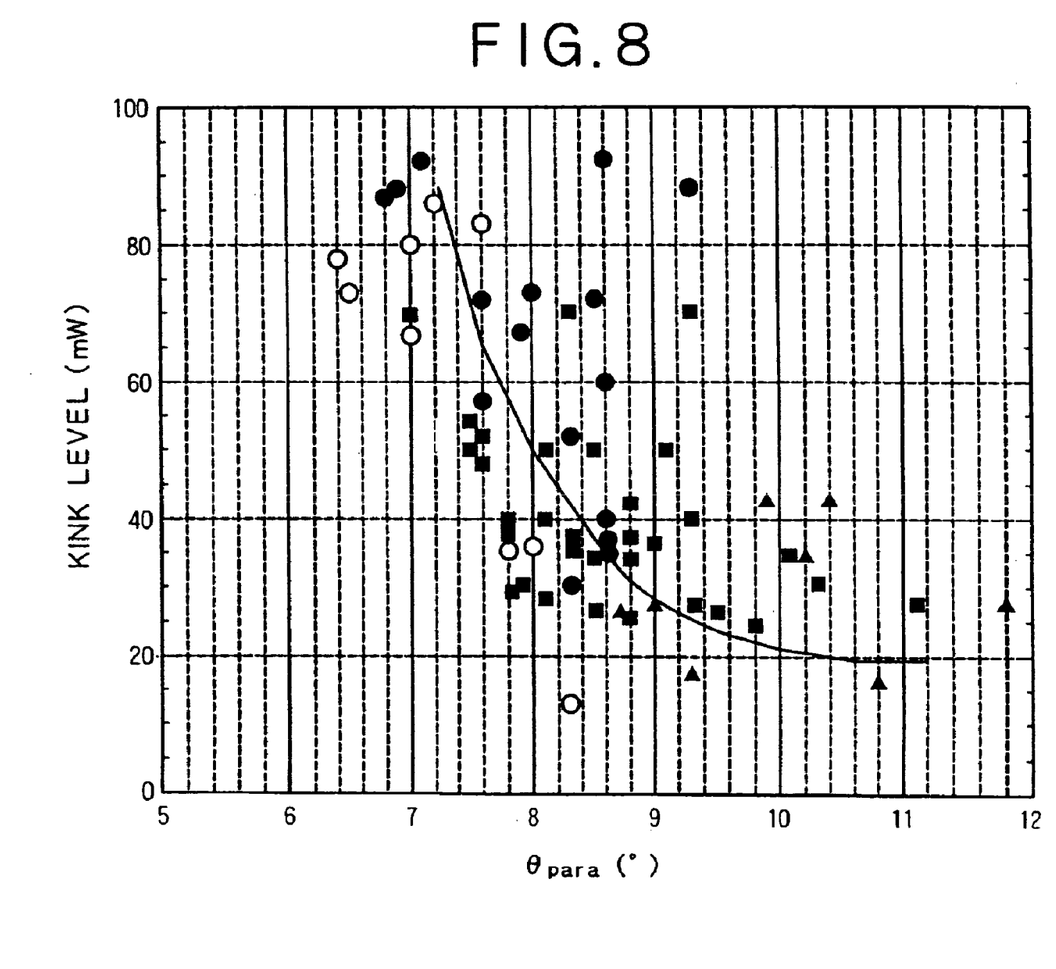
FIG. 8 is a graph showing a relationship between a kink level and a half-value width $\theta_{para}$.

If the half-value width $\theta_{para}$ is made large by making the effective refractive index difference $\Delta n$ large, the cutoff ridge width becomes small, with a result that the laser characteristic at the time of operation with a high power is degraded. Accordingly, with respect to the ridge width, the increase in half-value width and the enhancement of the laser characteristic at the time of operation with a high power is, as shown in FIG. 8, inconsistent with each other. It is to be noted that different marks such as closed circles, open circles, closed squares, and open squares shows experimental results.

The present inventors has further made studies and experiments, and found that a desired effective refractive index difference $\Delta n$, that is, a desired half-value width $\theta_{para}$ can be determined by adjusting at least either of a thickness of an electrode film, a kind and thickness of an insulating film, and a kind and a thickness of a portion, located on each of both sides of the ridge, of a cladding layer. The present inventor has further found that if the semiconductor laser device is a GaN based semiconductor laser device, a desired effective refractive index $\Delta n$, that is, a desired half-value width $\theta_{para}$ can be determined by adjusting at least either of a thickness of an electrode film, a kind and thickness of an insulating film, a kind and a thickness of a portion, located on each of both sides of the ridge, of a cladding layer, an Al composition ratio and a thickness of an AlGaN cladding layer, a thickness of a GaN optical guide layer, a thickness and an In composition ratio of a well layer of a GaInN.MQW active layer, and an In composition ratio of a barrier layer of the GaInN.MQW active layer.

The present inventor has further found that a ridge-waveguide type semiconductor laser device having a desired half-value width $\theta_{para}$ while keeping a desired kink level by combining a ridge width W in a specific range with an effective refractive index difference $\Delta n$ in a specific range. The present inventor has thus accomplished the present invention.

Figure 9:
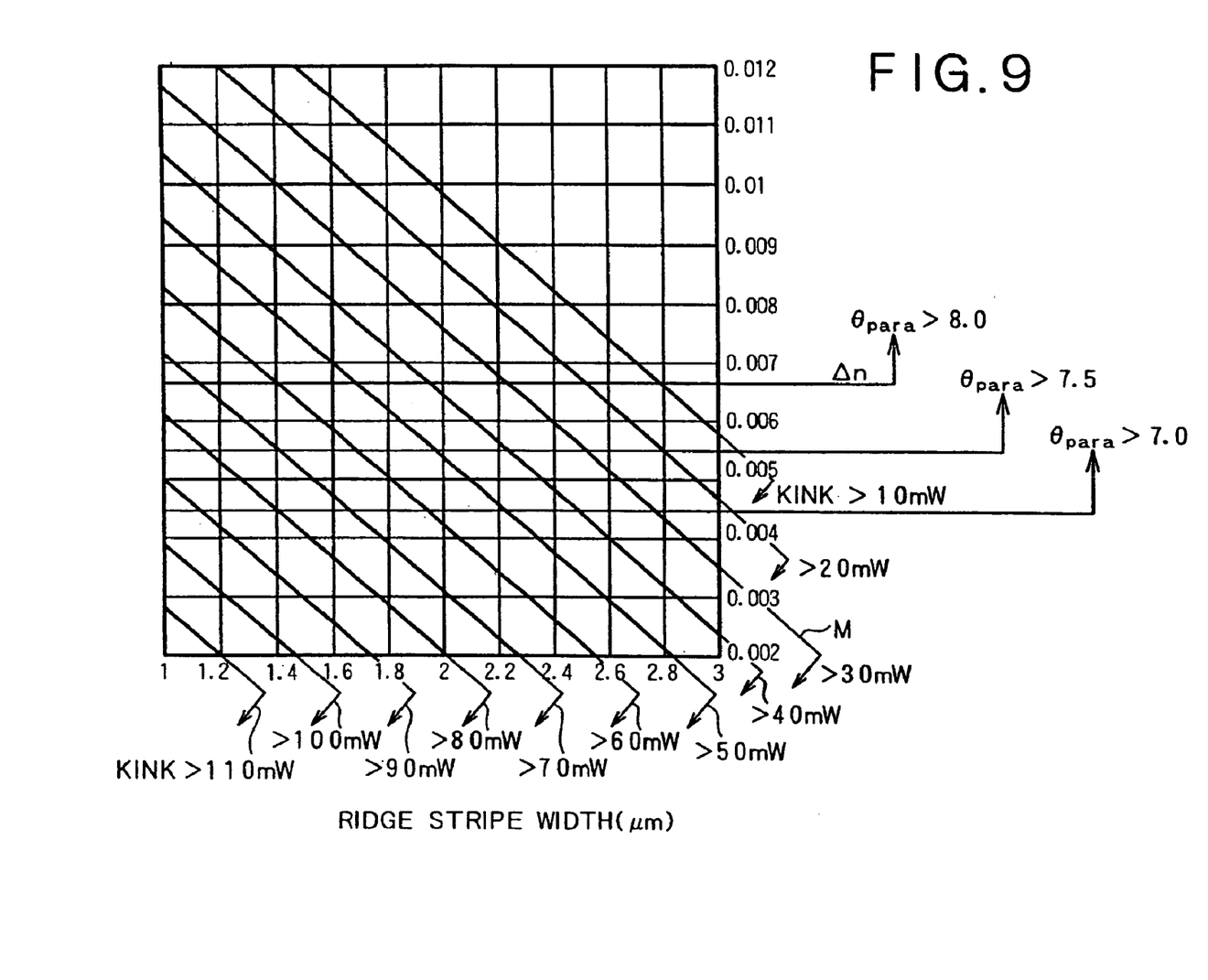
FIG. 9 is a graph determining combinations of a ridge width W and an effective refractive index difference Δn, each of which is capable of realizing a desired half-value width $\theta_{para}$ and a desired kink level, on X-Y coordinates on which the ridge width W (μm) is plotted on the X-axis and Δn is plotted at a rate of 0.001 on the Y-axis.

FIG. 9 is a graph showing combinations of W and $\Delta n$, each of which can realize a desired half-value width $\theta_{para}$ and a desired kink level, on X-Y coordinates on which W (μm) is plotted on the X-axis and $\Delta n$ is plotted at a rate of 0.001 on the Y-axis, wherein $\Delta n$, which is an effective refractive index difference between an effective refractive index $n_{eff1}$ of a ridge for an oscillation wavelength and an effective refractive index $n_{eff2}$ of a portion on each of both sides of the ridge for the oscillation wavelength, is taken as $\Delta n = n_{eff1} - n_{eff2}$, and W is a ridge width.

In FIG. 9, a slant line, that is, $\Delta n \leq a \times W + b$ shows the kink level. For example, a slant line M is $\Delta n \leq -0.004 \times W + 0.0157$, which shows that the kink level is 30 mW.

To achieve the above object, on the basis of the above-described knowledge, according to a first aspect of the present invention, there is provided a ridge-waveguide type semiconductor laser device including: a stripe-shaped ridge formed in an upper portion of at least an upper cladding layer, and an insulating film functioning as a current constriction layer, the insulating film being formed on both side surfaces of the ridge and on portions, located both the sides of the ridge, of the upper cladding layer. In this method, first, an effective refractive index difference $\Delta n$ between an effective refractive index $n_{eff1}$ of the ridge for an oscillation wavelength and an effective refractive index $n_{eff2}$ of a portion on each of both sides of the ridge for the oscillation wavelength is taken as $\Delta n = n_{eff1} - n_{eff2}$, and a ridge width is taken as W. On such an assumption, at least either of a kind and thickness of the insulating film, a thickness of an electrode film on the insulating film, a ridge height, a kind of the upper cladding layer, and a thickness of a remaining layer portion, located on each of both the sides of the ridge, of the upper cladding layer is set such that a combination of W and $\Delta n$ is located in a specific $\Delta n$-W region on X-Y coordinates on which W (μm) is plotted on the X-axis and $\Delta n$ is plotted on the Y-axis. The specific $\Delta n$-W region is defined so as to satisfy the following three equations. The first equation (1) is expressed by $\Delta n \leq a \times W + B$, where "a" and "b" are constants determining a kink level. The second equation (2) is expressed by $W \geq c$, where "c" is a constant specifying a minimum ridge width at the time of formation of the ridge. The third equation (3) is expressed by $\Delta n \geq d$, where "d" is a constant specified by a desired half-width value $\theta_{para}$ of a far-field pattern in a direction horizontal to a hetero-interface of a resonance structure of the laser device.

According to the present invention, at least either of a thickness of an electrode film, a kind and thickness of an insulating film, and a kind and a thickness of a remaining layer portion, located on each of both the sides of the ridge, of the upper cladding layer is set such that a combination of the effective refractive index difference Δn and the ridge width W satisfies the equations (1), (2) and (3), to thereby adjust the effective refractive index difference Δn and set the ridge width W, so that it is possible to realize a semiconductor laser device having a desired kink level specified by the equation (1) and a desired half-value width $\theta_{para}$ specified by the equation (3).

To achieve the above object, according to a second aspect of the present invention, there is provided a method of fabricating a ridge-waveguide type semiconductor laser device having a structure that an upper portion of at least an upper cladding layer is formed into a stripe-shaped ridge, and an insulating film functioning as a current constriction layer is formed on both side surfaces of the ridge and on portions, located both the sides of the ridge, of the upper cladding layer. The method includes a constant setting step of assuming that an effective refractive index difference Δn between an effective refractive index $n_{eff1}$ of the ridge for an oscillation wavelength and an effective refractive index $n_{eff2}$ of a portion on each of both sides of the ridge for the oscillation wavelength is taken as $\Delta n = n_{eff1} - n_{eff2}$, and a ridge width is taken as W, and setting, on X-Y coordinates on which W (μm) is plotted on the X-axis and Δn is plotted on the Y-axis, constants "a", "b", "c", and "d" of the following three equations. The first equation (1) is expressed $\Delta n \leq a \times W + B$, where "a" and "b" are constants determining a kink level. The second equation (2) is expressed by $W \geq c$, where "c" is a constant specifying a minimum ridge width at the time of formation of the ridge. The third equation (3) is expressed by $\Delta n \geq d$, where "d" is a constant specified by a desired half-width value $\theta_{para}$ of a far-field pattern in a direction horizontal to a hetero-interface of a resonance structure of the laser device.

Since the constants "a", "b", "c" and "d" in the three equations (1), (2) and (3) to be set in the constant setting step differ depending on a thickness of an electrode film, a kind and a thickness of the insulating film, a ridge height, and a kind and a thickness of the portion, located on each of both the sides of a ridge, of the upper cladding layer, and therefore, they are required to be experimentally determined.

To be more specific, the constants "a" and "b" in the equation (1) may be determined by establishing a relationship between Δn and the kink level, for example, a relationship shown on the right side of FIG. 5, by experiments, and the constant "d" in the equation (3) may be determined by establishing a relationship between Δn and $\theta_{para}$, for example, a relationship shown on the left side of FIG. 5, by experiments. In addition, the constant "c" in the equation (2) is a value limited by an etching step at the time of formation of the ridge.

The application of the nitride semiconductor laser and the fabrication method thereof according to the present invention is not limited to a nitride based III–V group compound semiconductor laser device. The nitride semiconductor laser and the fabrication method thereof according to the present invention can be applied to GaAs based, InP based, AlGaAs based, and GaN based semiconductor laser devices irrespective of a kind of a compound semiconductor layer forming a resonance structure of the semiconductor laser device and a kind of a contact layer insofar as the semiconductor laser is of a ridge-waveguide type.

DETAILED DESCRIPTION OF THE PREFERRED EMBODIMENTS

Hereinafter, preferred embodiments of the present invention will be described in detail by way of examples with reference to the accompanying drawings.

Embodiment 1

Figure 1:
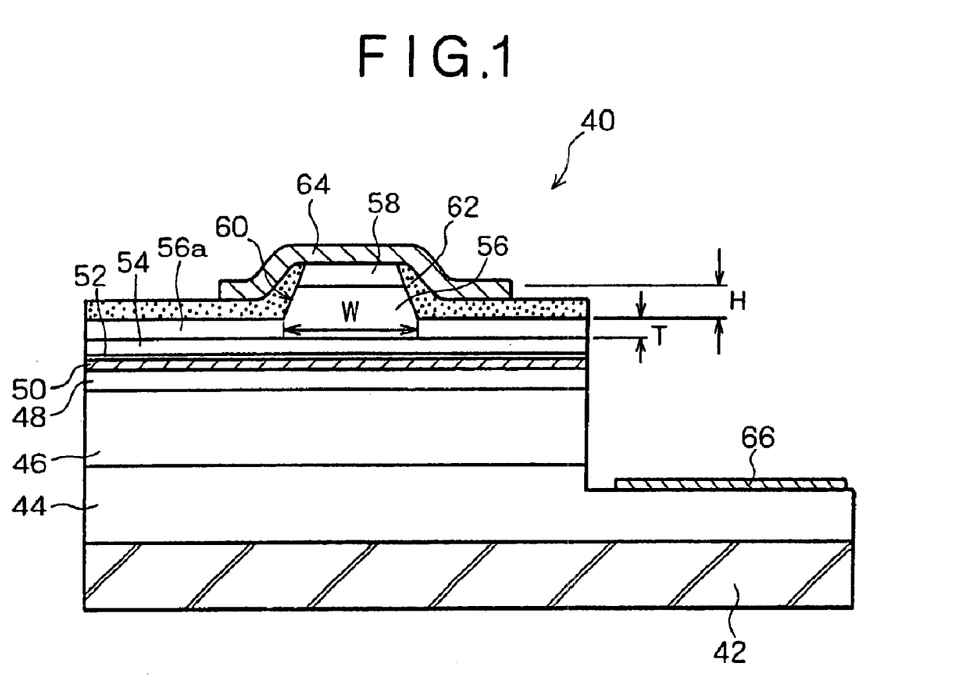
FIG. 1 is a sectional view showing a configuration of a nitride based semiconductor laser device according to Embodiment 1.

In this embodiment, the semiconductor laser device of the present invention is applied to a nitride based III–V group compound semiconductor laser device (hereinafter, referred to as "nitride based semiconductor laser device"). FIG. 1 is a sectional view showing a configuration of the nitride based semiconductor laser device according to this embodiment.

Referring to FIG. 1, a nitride based semiconductor laser device 40 according to this embodiment has a stacked structure in which a plurality of layers are stacked on a sapphire substrate 42 via a GaN buffer layer (not shown). The plurality of layers stacked on the sapphire substrate 42 are an n-$Al_{0.05}Ga_{0.95}N$ contact layer 44 having a thickness of 5 μm, an n-(GaN:Si/$Al_{0.1}Ga_{0.9}$N)-SLS cladding layer 46, an n-GaN optical guide layer 48 having a thickness of 0.15 μm, a GaInN.MQW active layer 50 having three well layers each having a thickness of 4 nm and four barrier layers each having a thickness of 10 nm, a p-$Al_{0.35}Ga_{0.65}$N deterioration preventing layer 52 having a thickness of 0.01 μm, a p-GaN optical guide layer 54 having a thickness of 0.15 μm, a p-(GaN:Mg/$Al_{0.1}Ga_{0.9}$N)-SLS cladding layer 56, and a p-GaN contact layer 58 having a thickness of 0.015 μm.

In this stacked structure, an upper portion of the p-cladding layer 56 and the p-contact layer 58 are formed as a stripe-shaped ridge 60. An upper portion of the n-contact layer 44, the n-cladding layer 46, the n-optical guide layer 48, the MQW active layer 50, the p-deterioration preventing layer 52, the p-optical guide layer 54, and both remaining layer portions 56a of the p-cladding layer 56 are formed as a mesa structure extending in the same direction as the extending direction of the ridge 60.

A ridge width W of the ridge 60 is typically set to 1.6 μm, a ridge height H is typically set to 0.35 μm, and a thickness T of each of the remaining layer portions 56a, located on both sides of the ridge 60, of the p-cladding layer 56 is typically set to 0.15 μm.

A ZrO$_2$ film 62 having a thickness of 0.2 μm is formed as a current constriction layer on both side surfaces of the ridge 60 and the remaining layer portions 56a, located on both the sides of the ridge 60, of the p-cladding layer 56.

A p-side electrode 64 composed of a multi-layer metal film made from Ti/Au is formed on the ZrO$_2$ film 62 in such a manner as to be brought into contact with the p-contact layer 58 via a window formed in the ZrO$_2$ film 62. An n-side electrode 66 composed of a multi-layer metal film made from Ti/Al is formed on the n-contact layer 44.

The nitride based semiconductor laser device 40 according to this embodiment is fabricated in the following manner. First, an effective refractive index difference Δn between an effective refractive index $n_{eff1}$ of the ridge for an oscillation wavelength and an effective refractive index $n_{eff2}$ of a portion on each of both sides of the ridge for the oscillation wavelength is taken as Δn=$n_{eff1}$−$n_{eff2}$, and a ridge width is taken as W. On such an assumption, constants "a", "b", "c", and "d" of the following three equations are set on X-Y coordinates on which W (μm) is plotted on the X-axis and Δn is plotted at a rate of 0.001 on the Y-axis.

The first equation is expressed by $$\Delta n \leq a \times W + B \quad (1)$$

where "a" and "b" are constants determining a kink level.

The second equation is expressed by $$W \geq c \quad (2)$$

where "c" is a constant specifying a minimum ridge width at the time of formation of the ridge.

The third equation is expressed by $$\Delta n \geq d \quad (3)$$

where "d" is a constant specified by a desired half-width value $\theta_{para}$.

The constant "d" is determined by using a graph, for example, as shown in FIG. 5, which is previously prepared by experiments.

After the constants "a", "b", "c", and "d" are set, the effective refractive index difference Δn and the ridge width W are set by adjusting at least either of a thickness of an electrode film, a kind and a thickness of an insulating film, and a kind and a thickness of a portion, located on each of both the sides of the ridge, of the upper cladding layer in such a manner that a combination of Δn and W satisfies the above-described three equations (1), (2) and (3).

In the case of the nitride based semiconductor laser device 40 according to this embodiment, for example, in order to set the kink level to 50 mW or more and also set the half-value width $\theta_{para}$ to 7.5° or more, the constant "a" in the equation (1) is set to −0.004, and the constant "b" is set to 0.0123; the constant "c" in the equation (2) is set to 1.0 μm from the limitation at the time of formation of the ridge; and the constant "d" in the equation (3) is set to 0.0056.

Inventive Example 1

Figure 2:
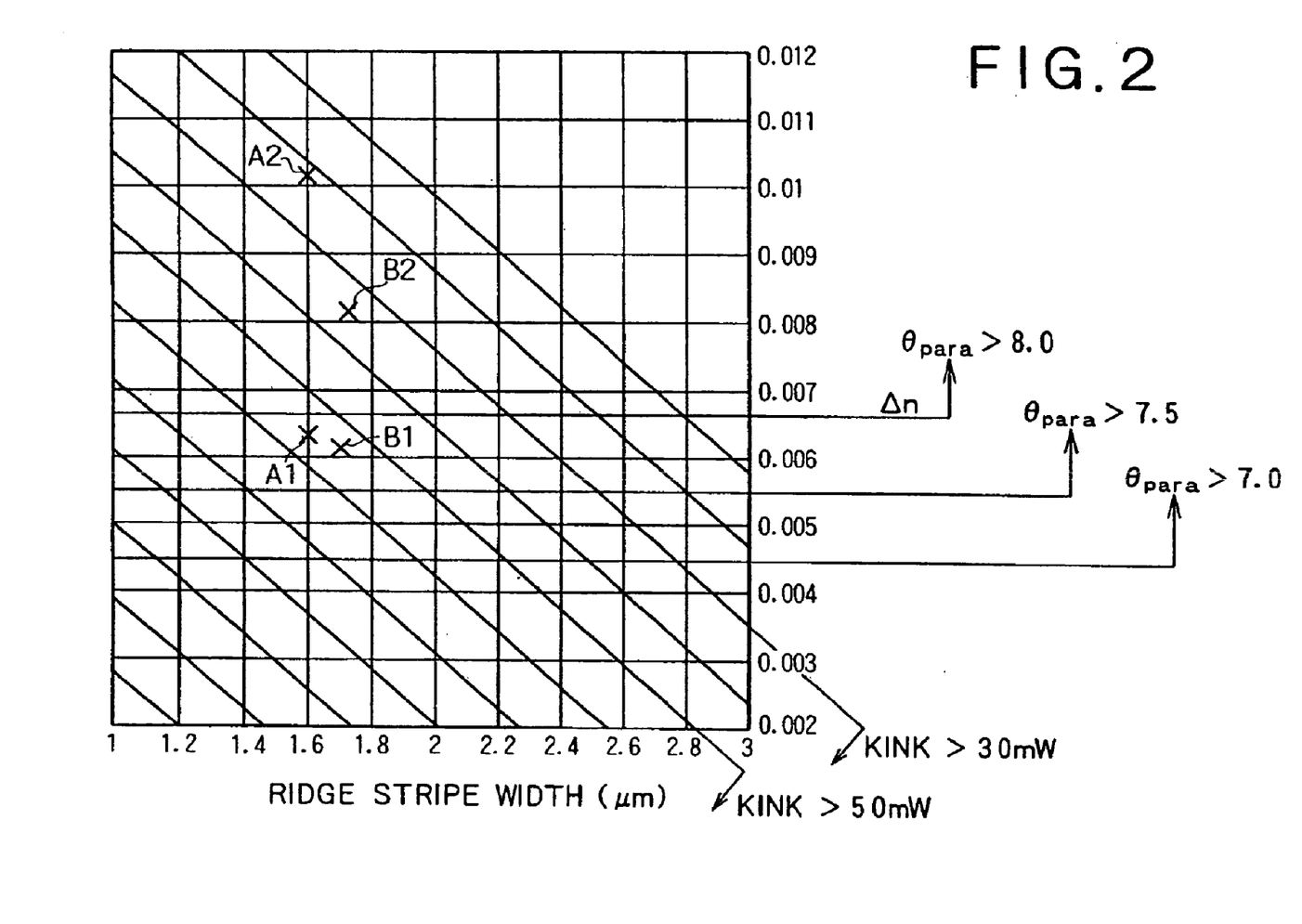
FIG. 2 is a graph showing half-value widths $\theta_{para}$ and kink levels in Inventive Examples 1 and 2 and Comparative Examples 1 and 2.

When the thickness T of the remaining layer portion 56a of the p-cladding layer 56 is set to 0.15 μm, the ridge width W is set to 1.6 μm, and the Al composition y of the p-(GaN:Mg/Al$_y$Ga$_{1-y}$N)-SLS cladding layer 56 is set to 0.1, the effective refractive index difference Δn becomes 0.0063. Accordingly, as shown in character A1 of FIG. 2, the half-value width $\theta_{para}$ becomes 8.7° and the kink level becomes 57 mW.

The laser device in Inventive Example 1 can satisfy the requirement that the kink level is 50 mW or more and the half-value width $\theta_{para}$ is 7.5° or more.

Comparative Example 1

When the thickness T of the remaining layer portion 56a of the p-cladding layer 56 is set to 0.12 μm, the ridge width W is set to 1.6 μm, and the Al composition y of the p-(GaN:Mg/Al$_y$Ga$_{1-y}$N)-SLS cladding layer 56 is set to 0.1, the effective refractive index difference Δn becomes 0.0102. Accordingly, as shown in character A2 of FIG. 2, the half-value width $\theta_{para}$ becomes as high as 10.2° or more but the kink level becomes as low as 20 mW.

The laser device in Comparative Example 1 cannot satisfy the requirement that the kink level is 50 mW or more and the half-value width $\theta_{para}$ is 7.5° or more.

Embodiment 2

Figure 3:
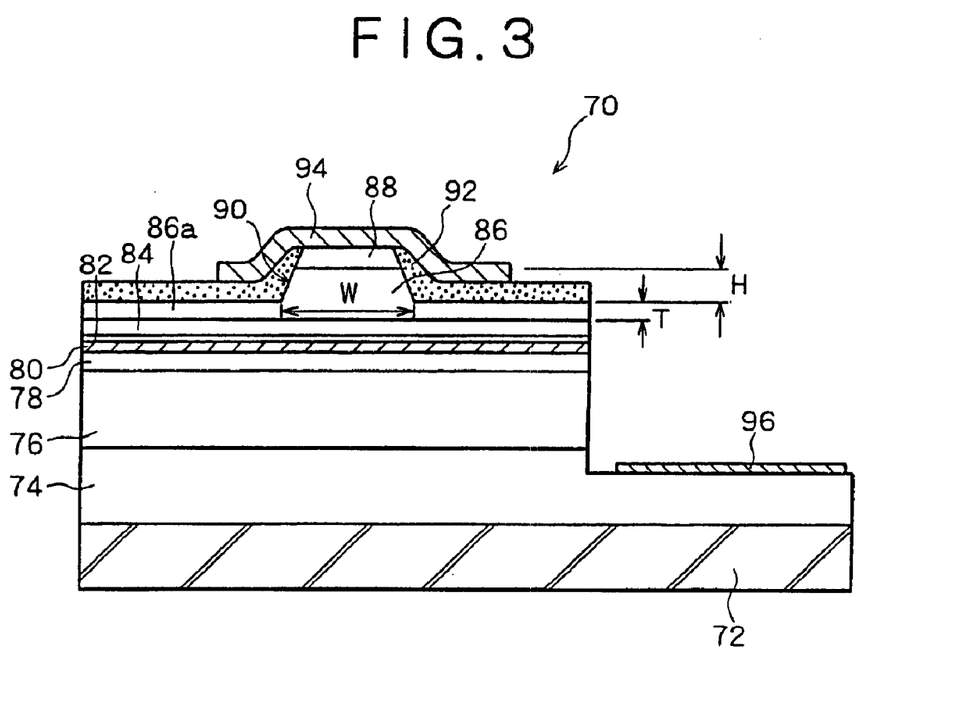
FIG. 3 is a sectional view showing a configuration of a nitride based semiconductor laser device according to Embodiment 2.

In this embodiment, the semiconductor laser device of the present invention is applied to a nitride based semiconductor laser device different from that in Embodiment 1. FIG. 3 is a sectional view showing a configuration of the nitride based semiconductor laser device according to this embodiment.

Referring to FIG. 3, a nitride based semiconductor laser device 70 according to this embodiment has a stacked structure in which a plurality of layers are stacked on a sapphire substrate 72 via a GaN buffer layer (not shown). The purality of layers stacked on the sapphire substrate 72 are an n-GaN contact layer 74 having a thickness of 5 μm, an n-Al$_x$Ga$_{1-x}$N cladding layer 76 having a thickness of 1.0 μm, an n-GaN optical guide layer 78 having a thickness of 0.10 μm, a GaInN.MQW active layer 80 having three well layers each having a thickness of 3.5 nm and four barrier layers each having a thickness of 70 nm, a p-Al$_{0.18}$Ga$_{0.82}$N deterioration preventing layer 82 having a thickness of 0.01 μm, a p-GaN optical guide layer 84 having a thickness of 0.10 μm, a p-(GaN:Mg/Al$_{0.14}$Ga$_{0.86}$N)-SLS cladding layer 86, and a p-GaN contact layer 88 having a thickness of 0.1 μm.

In this stacked structure, an upper portion of the p-cladding layer 86 and the p-contact layer 88 are formed as a stripe-shaped ridge 90. An upper portion of the n-contact layer 74, the n-cladding layer 76, the n-optical guide layer 78, the MQW active layer 80, the p-deterioration preventing layer 82, the p-optical guide layer 84, and both remaining layer portions 86a of the p-cladding layer 86 are formed as a mesa structure extending in the same direction as the extending direction of the ridge 90.

A ridge width W of the ridge 90 is typically set to 1.7 μm, a ridge height H is typically set to 0.35 μm, and a thickness T of each of the remaining layer portions 86a, located on both sides of the ridge 90, of the p-cladding layer 86 is typically set to 0.15 μm.

A SiO$_2$ film 92 having a thickness of 0.2 μm is formed as a current constriction layer on both side surfaces of the ridge 90 and the remaining layer portions 86a, located on both the sides of the ridge 90, of the p-cladding layer 86.

A p-side electrode 94 composed of a multi-layer metal film made from Pd/Pt/Au is formed on the SiO$_2$ film 92 in such a manner as to be brought into contact with the p-contact layer 88 via a window formed in the SiO$_2$ film 92. An n-side electrode 96 composed of a multi-layer metal film made from Ti/Pt/Au is formed on the n-contact layer 74.

In the case of the nitride based semiconductor laser device 70 according to this embodiment, for example, in order to set the kink level to 50 mW or more and also set the half-value width $\theta_{para}$ to 7.5° or more, the constant "a" in the equation (1) is set to 0.004, and the constant "b" is set to 0.0123; the constant "c" in the equation (2) is set to 1.0 μm from the limitation at the time of formation of the ridge; and the constant "d" in the equation (3) is set to 0.0056.

Inventive Example 2

When the thickness T of the remaining layer portion 86a of the p-cladding layer 86 is set to 0.15 μm, the ridge width W is set to 1.7 μm, and the Al composition y of the p-(GaN:Mg/Al$_y$Ga$_{1-y}$N)-SLS cladding layer 86 is set to 0.05, the effective refractive index difference Δn becomes 0.0062. Accordingly, as shown in character B1 of FIG. 2, the half-value width θ$_{para}$ becomes 8.53° and the kink level becomes 55 mW.

The laser device in Inventive Example 2 can satisfy the requirement that the kink level is 50 mW or more and the half-value width θ$_{para}$ is 7.5° or more.

Comparative Example 2

When the thickness T of the remaining layer portion 86a of the p-cladding layer 86 is set to 0.15 μm, the ridge width W is set to 1.7 μm, and the Al composition y of the p-(GaN:Mg/Al$_y$Ga$_{1-y}$N)-SLS cladding layer 86 is set to 0.07, the effective refractive index difference Δn becomes 0.0081. Accordingly, as shown in character B2 of FIG. 2, the half-value width θ$_{para}$ becomes as high as 9.3° but the kink level becomes as low as 33 mW.

The laser device in Comparative Example 2 cannot satisfy the requirement that the kink level is 50 mW or more and the half-value width θ$_{para}$ is 7.5° or more.

According to Embodiments 1 and 2, a nitride based semiconductor laser device having a desired half-width value θ$_{para}$ and a desired kink level while keeping a specific ridge width can be easily designed by determining an effective refractive index difference Δn with a kind of an upper cladding layer and a thickness of a remaining layer portion of an upper cladding layer taken as parameters. In other words, according to these embodiments, a nitride based semiconductor laser device having a desired half-value width θ$_{para}$ and a desired kink level can be easily designed by using the equations (1), (2) and (3) as a criterion of the design.

As described above, according to the present invention, a semiconductor laser device having a desired half-value width θ$_{para}$ and a desired kink level can be easily designed and fabricated by setting at least either of a kind and thickness of an insulating film, a thickness of an electrode film on the insulating film, a ridge height, a kind of an upper cladding layer, and a thickness of a remaining layer portion, located on each of both the sides of the ridge, of the upper cladding layer in such a manner that a combination of the ridge width W and an effective refractive index difference Δn is located in a specific Δn-W region.

The fabrication method of the present invention can provide a design technique suitable for fabricating the semiconductor laser device of the present invention. A nitride based III–V group compound semiconductor laser device having a desired half-width value θ$_{para}$ of, for example, 7° or more and a high kink level can be easily designed by using the fabrication method of the present invention.

What is claimed is:

1. A ridge-waveguide type semiconductor laser device comprising:
   an active region between upper and lower cladding layers;
   a stripe-shaped ridge formed in an upper portion of at least said upper cladding layer, said ridge having side surfaces; and
   an insulating film functioning as a current constriction layer, said insulating film being formed on said side surfaces of said ridge;
   wherein,
   on the assumption that an effective refractive index difference Δn between an effective refractive index n$_{eff1}$ of said ridge for an oscillation wavelength, that an effective refractive index n$_{eff2}$ of a portion on each of both sides of said ridge for the oscillation wavelength is Δn=n$_{eff1}$−n$_{eff2}$, and a ridge width is W;
   at least one of a kind and thickness of said insulating film, a thickness of an electrode film on said insulating film, a ridge height, a kind of said upper cladding layer, and a thickness of a remaining layer portion, located on each of both the sides of said ridge, of said upper cladding layer is set such that a combination of W and Δn is located in a specific Δn-W region on X-Y coordinates on which W (μm) is plotted on the X-axis and Δn is plotted on the Y-axis,
   said specific Δn-W region being defined so as to satisfy the following three equations:

$$\Delta n \leq -0.004 \times W + 0.0123, \quad (1)$$

$$W \geq 1.0 \text{ μm, and} \quad (2)$$

$$\Delta n \geq 0.0056. \quad (3)$$

2. A method of fabricating a ridge-waveguide type semiconductor laser device having a structure such that an upper portion of at least an upper cladding layer is formed into a stripe-shaped ridge with side surfaces, and an insulating film functioning as a current constriction layer is formed on said side surfaces of said ridge, said method comprising the steps of:
   setting a constant assuming that an effective refractive index difference Δn between an effective refractive index n$_{eff1}$ of said ridge for an oscillation wavelength and an effective refractive index n$_{eff2}$ of a portion on each of both sides of said ridge for the oscillation wavelength is Δn=n$_{eff1}$−n$_{eff2}$, and a ridge width is W, and setting, on X-Y coordinates on which W (μm) is plotted on the X-axis and Δn is plotted on the Y-axis, constants "a", "b", "c", and "d" of the following three equations:

$$\Delta n \leq -0.004 \times W + 0.0123 \quad (1)$$

$$W \geq 1.0 \text{ μm} \quad (2)$$

$$\Delta n \geq 0.0056 \quad (3)$$

forming a device with an active region between a lower cladding layer and the upper cladding layer; and
   forming said insulating layer on said side surfaces of said ridge,
   wherein,
   said ridge and insulating layers are formed taking into consideration said constant.

3. A method of fabricating a ridge-waveguide type semiconductor laser device according to claim 2, wherein said constants "a" and "b" in said equation (1) are determined by establishing a relationship between Δn and the kind level by experiments;
   said constant "d" in said equation (3) is determined by establishing a relationship between Δn and θ$_{para}$ by experiments; and
   said constant "c" in said equation (2) is a value limited by an etching step at the time of formation of said ridge.

4. A method of fabricating a ridge-waveguide type semiconductor laser device according to claim 2, further comprising:
   a film thickness and the like setting step of setting at least either of a kind and thickness of said insulating film, a thickness of an electrode film on said insulating film, a ridge height, a kind of said upper cladding layer, and a thickness of a remaining layer portion, located on each of both the sides of said ridge, of said upper cladding layer in such a manner that a combination of Δn and W satisfies said three equations (1), (2) and (3).

5. A method of fabricating a ridge-waveguide type semiconductor laser device according to claim 3, further comprising:

a film thickness and the like setting step of setting at least either of a kind and thickness of said insulating film, a thickness of an electrode film on said insulating film, a ridge height, a kind of said upper cladding layer, and a thickness of a remaining layer portion, located on each of both the sides of said ridge of said upper cladding layer in such a manner that a combination of Δn and W satisfies said three equations (1), (2) and (3).

6. A method of fabricating a ridge-waveguide type semiconductor laser device according to claim 4, wherein when said semiconductor laser device is a GaN based semiconductor laser device, in said film thickness and the like setting step, at least either of a kind and thickness of said insulating film, a thickness of an electrode film on said insulating film, a ridge height, a kind of said upper cladding layer, a thickness of a remaining layer portion, located on each of both the sides of said ridge, of said upper cladding layer, an Al composition ratio and a thickness of an AlGaN cladding layer, a thickness of a GaN optical guide layer, a thickness and an In composition ratio of a well layer of a GaInN-multi-quantum well active layer, is set in such a manner that a combination of W and Δn satisfies said three equations (1), (2) and (3).

7. A method of fabricating a ridge-waveguide type semiconductor laser device according to claim 5, wherein when said semiconductor laser device is a GaN based semiconductor laser device, in said film thickness and the like setting step, at least either of a kind and thickness of said insulating film, a thickness of an electrode film on said insulating film, a ridge height, a kind of said upper cladding layer, a thickness of a remaining layer portion, located on each of both the sides of said ridge, of said upper cladding layer, an Al composition ratio and a thickness of an AlGaN cladding layer, a thickness of a GaN optical guide layer, a thickness and an In composition ratio of a well layer of a GaInN-multi-quantum well active layer, is set in such a manner that a combination of W and Δn satisfies said three equations (1), (2) and (3).

* * * * *